United States Patent [19]

Chapron

[11] 4,243,896
[45] Jan. 6, 1981

[54] I²L CIRCUIT WITH AUXILIARY TRANSISTOR

[75] Inventor: Claude Chapron, Caen, France

[73] Assignee: U.S. Philips Corporation, New York, N.Y.

[21] Appl. No.: 799,678

[22] Filed: May 23, 1977

Related U.S. Application Data

[63] Continuation of Ser. No. 675,605, Apr. 9, 1976, abandoned.

[30] Foreign Application Priority Data

Apr. 14, 1975 [FR] France .................................. 75 11504

[51] Int. Cl.³ .......................................... H03K 19/091
[52] U.S. Cl. ............................. 307/213; 307/DIG. 1; 307/296 R; 357/92
[58] Field of Search ............................ 357/44, 46, 92; 307/DIG. 1, 213, 215, 296 R

[56] References Cited

U.S. PATENT DOCUMENTS

| | | | |
|---|---|---|---|
| 4,013,901 | 3/1977 | Williams | 357/92 |
| 4,035,664 | 7/1977 | Berger et al. | 357/46 |

FOREIGN PATENT DOCUMENTS

| | | | |
|---|---|---|---|
| 7107040 | 11/1972 | Netherlands | 357/92 |
| 7411913 | 3/1975 | Netherlands | 357/92 |

OTHER PUBLICATIONS

Elmasry, Electronics Letters, vol. 11, No. 3, Feb. 6, 1975, pp. 63–64 (and 68).

Primary Examiner—William D. Larkins
Attorney, Agent, or Firm—Thomas A. Briody; Robert T. Mayer; James J. Cannon, Jr.

[57] ABSTRACT

The invention relates to an I²L circuit in which the transistors provided with current injectors are distributed between a number of groups which are connected in series as stages between the supply connections. For the logic signal connections between a higher and a lower stage, a current source is used which is controlled from the higher stage and which is connected to the base of a controlled transistor in the lower stage. According to the invention, the switching time of the controlled transistor is reduced by providing a conductive connection which comprises the collector-emitter path of an auxiliary transistor between the base of the controlled transistor and a suitable point of a reference potential.

10 Claims, 7 Drawing Figures

I²L CIRCUIT WITH AUXILIARY TRANSISTOR

This is a continuation of Ser. No. 675,605, filed Apr. 9, 1976, now abandoned.

BACKGROUND OF THE INVENTION

1. Field of the Invention

This invention relates to integrated circuits having transistors provided with current injectors, the transistors having bases and collectors, several of said transistors being connected to associated current injectors for supplying bias current. Each current injector has at least a first, a second and a third layer, which are successive layers separated from each other by rectifying junctions. Two connections for a supply source are present, so that the transistors with their associated current injectors are distributed among several groups which require approximately equal bias currents and which are connected in series between the two connections. A first of the groups forms a highest stage in the series arrangement. The first layer of the associated current injector(s) is connected to the one connection. Another one of the groups forms a lowest stage in the series arrangement. The second layer of the associated current injector(s) is connected to the second connection.

The remaining groups form intermediate stages. The higher stages in the series arrangement are present nearer to the highest stage than the lower ones, the second layer of the associated current injector(s) of the highest stage being connected to the first layer of the associated current injector(s) of the next lower stage, and electric signal connection being present between a collector of a controlling transistor situated in a higher stage and a base of a controlled transistor situated in a lower stage. The signal connection comprises at least an auxiliary transistor of a type complementary to that of the controlling and the controlled transistor, the collector of the complementary auxiliary transistor being connected to the base of the controlled transistor.

2. Description of the Prior Art

Such I²L circuits are known from U.S. Pat. No. 4,007,385. The signal connection comprises a current source for activating the controlled transistor. When the auxiliary transistor is conductive, the base of the controlled transistor receives bias current so that the latter is also conductive. When the current through the auxiliary transistor is interrupted by means of the controlling transistor, the controlled transistor switches to the non-conductive state for lack of base current.

The disadvantage of this known I²L circuit is that in certain circumstances the switching of the controlled transistor to the non-conductive state occurs relatively slowly. This switching time depends on the time which is necessary to dissipate the charge which is stored in the controlled transistor.

It is one of the objects of the present invention to shorten the switching time.

SUMMARY OF THE INVENTION

The present invention provides an integrated I²L circuit in which a stage is situated lower than the higher stage in which the controlling transistor is present; a second auxiliary transistor, of the same type as the controlling and controlled transistor is connected to an associated current injector and connected parallel to the emitter-base junction of the controlled transistor. The second auxiliary transistor is conductive at least during the period in which the controlled transistor is conductive, and for the period necessary to bring the controlled transistor in the non-conductive state. The invention further provides an integrated injection logic circuit including controlling and controlled transistors. Connected to at least some of the transistors for the purpose of biasing such transistors are associated biasing current injectors, each having at least first, second and third zones. The first and second zones form a first rectifying junction, while the second and third zones form a second rectifying junction.

There is also provided a connection from the controlling transistor collectors to the controlled transistor bases. The transistors and associated current injectors form plural elementary groups which require substantially the same supply current. The plural groups are connected in series across the two terminals which connect to the current supply source so as to define a first in the series called the "highest stage", a last in the series called the "lowest stage", with higher and lower stages being defined as the higher stage being closer to the beginning of the series than a lower stage. A connection is also provided which connects the current injector first zone of the groups of transistors in the highest stage, without the interconnection of further stages, to a supply source terminal for biasing the first rectifying junction in the forward direction. Furthermore the current injector second zone of the group of transistors in the lowest stage is connected, without the interconnection of a further stage, to the other supply source terminal.

Preferably no further current sources are connected to the base of the controlled transistor. In so far as such current sources are present, the value of the current to be applied to the base of the controlled transistor is chosen to be such that the controlled transistor is conductive only when current is available from the signal connection.

In the case in which current is supplied by the signal connection, a part of the current is drained by the second auxiliary transistor, the value of that part being chosen to be such that the remaining part is sufficient to make the controlled transistor conductive. When the current path through the first auxiliary transistor is interrupted, the charge stored in the controlled transistor and the charge stored in the capacitances connected to the base of the transistor can be dissipated by the second auxiliary transistor. In the known I²L circuit, on the contrary, the stored charge can be dissipated substantially only by recombination.

The second auxiliary transistor is preferably connected uninterruptedly with its associated current injector so that said second auxiliary transistor during operation of the integrated circuit forms a permanent conductive connection between the base and the emitter of the controlled transistor.

In a preferred embodiment of the I²L circuit according to the invention, the second auxiliary transistor is situated in the same stage as the controlled transistor. In this case, the second auxiliary transistor together with the transistors of said stage provided with current injectors and the controlled transistor may be provided on the same semiconductor body, or on the same isolated semiconductor island of an integrated circuit. The addition of the second auxiliary transistor does not make the integrated circuit more complicated, and has substantially no influence on the reliability thereof.

The current injector associated with the second auxiliary transistor preferably has three successive layers, the first and the second layer being formed by the same layers as the first and the second layer of the current injector(s) associated with the other transistors present in the same stage.

The second auxiliary transistor may advantageously be used in an inverted transistor structure, in which the base and the emitter simultaneously form part of the associated current injector. Inverted transistor structures are conventional in I²L circuits. The second auxiliary transistor need not have a separate emitter contact and a base contact of its own, and may hence be very small.

The second auxiliary transistor with its current injector is preferably biased so that the current through the auxiliary transistor is substantially half of the current which flows in the signal connection in the conductive stage. One half of the current which is provided by the signal connection is consumed by the second auxiliary transistor, the other half serving as a base current for the controlled transistor.

The value of the current for dissipating charge stored in the base of the controlled transistor is determined, in particular, by the bias applied to the second auxiliary transistor. This bias can be influenced with the associated current injector. The last layer of the current injector which preferably coincides with the base of the controlled transistor may be considered as the collector of a complementary transistor. By means of the base thickness of the complementary transistor which may be chosen in the topology or lay-out of the integrated circuit, the bias current of the second auxiliary transistor can be controlled with respect to the other bias currents used in the circuit. Another possibility of influencing the bias current is the size of the injecting surface of the rectifying junction of the current injector across which the charge carriers are injected which are collected by the base of the second auxiliary transistor and provide the applied bias current. In practical embodiments the size of the injecting surface can usually be adjusted by the length across which the emitter-base junction of the above-mentioned complementary transistor of the current injector at the semiconductor surface are facing each other.

The invention will now be described in greater detail with reference to an embodiment and the accompanying drawing.

DESCRIPTION OF THE PREFERRED EMBODIMENT

Figure 7:
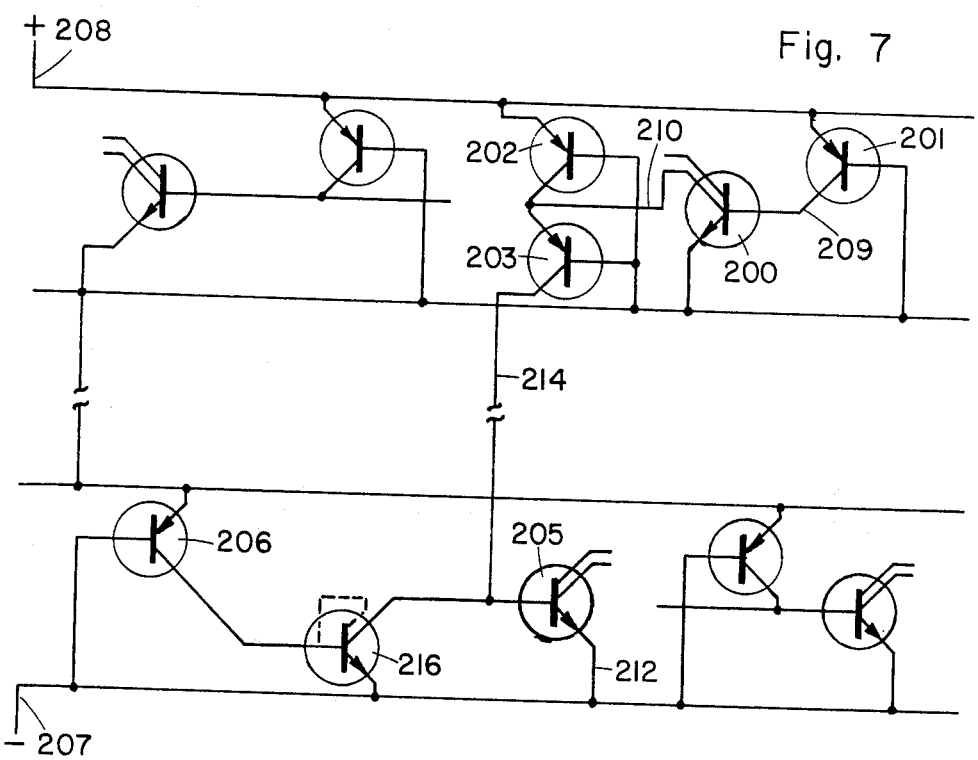
FIG. 7 is a second circuit similar to the circuit of FIG. 6.
Figure 6:
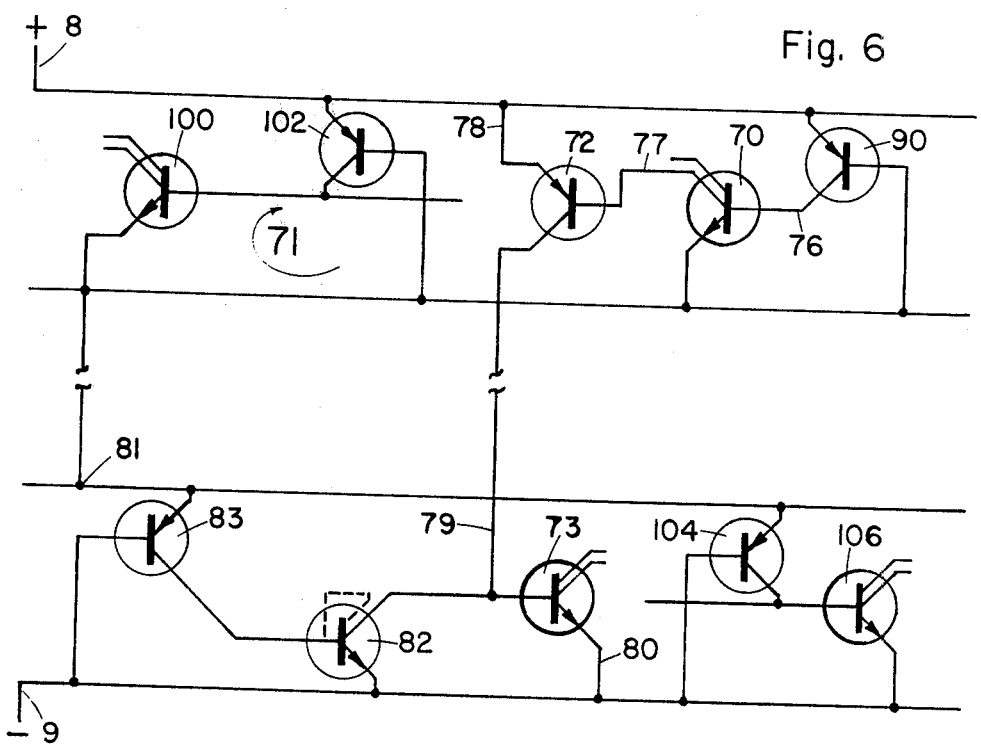
FIG. 6 shows in an electric circuit diagram how functional connections between a controlling transistor belonging to a higher stage and a controlled transistor belonging to a lower stage, can be realized by means of an auxiliary transistor.

FIGS. 6 and 7 are presented to show the context of the circuits in which the present invention is utilized.

In the diagram of FIG. 6 is shown an npn transistor 70 which has a current injector, the current injector being represented electrically by transistor 90. The transistor 70 has two collectors, and two signal outputs, one of which is connected to the signal input, that is to say, the base of an npn transistor 73 present in another stage. An information-carrying signal available at one or the other of the collectors of the transistor 73 may serve directly for controlling further npn transistors 106 having a current injector 83 and present in said stage. The current injector(s) of said stage is (are) represented by the transistors 83. The stages corresponding to the shown injectors 83, 90 in the series arrangement between the supply connections may be both adjoining stages and stages which are separated from each other by intermediate stages.

An auxiliary transistor 72 of the complementary type, in this case a pnp transistor, is incorporated in the connection between the npn transistors 70 and 73.

The emitter of the npn transistor 70 is connected electrically to and has the same potential as the n-type region of the transistor 90. The potential of the base zone of said transistor depends on the further part of the I²L circuit connected thereto. The base 76 may be considered as a signal output. One of the collectors of transistor 70 is connected to the base of the pnp auxiliary transistor 72 by a conductor 77. It is denoted by a connection 78 that the emitter of the auxiliary transistor 72 has the same potential as the p-type region of the transistor 102. The collector of the auxiliary transistor 72 is connected by means of a conductor 79 to the base or signal input of the npn transistor 73 present in a lower stage, while the connection 80 denotes that the emitter of the npn transistor 73 has the same potential as the n-type region of the transistor 82 and hence of the emitters of substantially all npn transistors of said stage having a current injector.

The npn transistor 73 may be entirely equal to the further npn transistors of said stage. The base of transistor 73 only does not have a current injector. The auxiliary transistor 72 has no current injector either.

As regards the supply, the circuit shown in FIG. 6 may be considered as having two supply terminals: a negative terminal 9 connected to the second layer of the current injector and a positive terminal 8 connected to the first layer of the current injector. As a result of the supply current which is supplied and which flows from terminal 8 to terminal 9, a voltage in the order of 0.7 volt occurs between the terminals of each of the stages.

The controlled transistor 73 is situated at a stage of which most transistors are provided with bias current by means of one or more associated current injectors which are shown diagrammatically by transistor 83, present between the connections 81 and 9, which the stage is incorporated in the series arrangement of stages. The signal connection 79 connects a controlling transistor present in a higher stage to the controlled transistor 73.

Figure 1:
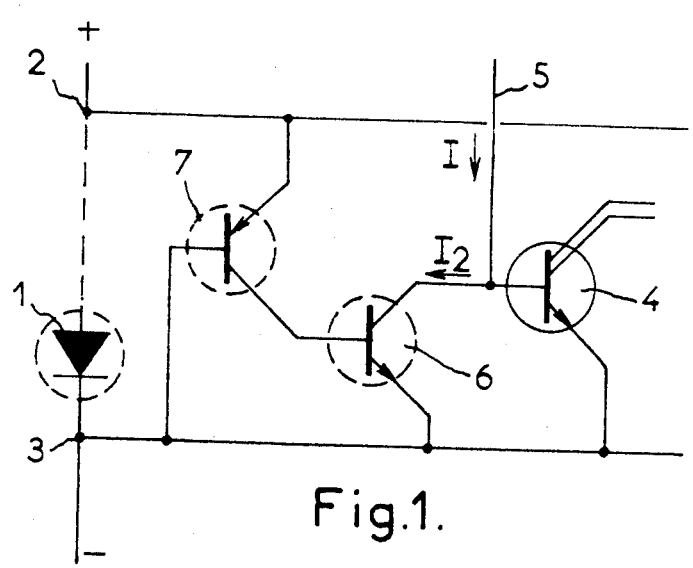
FIG. 1 shows a part of a circuit diagram of an embodiment of the I²L circuit according to the invention.

The diagram of FIG. 1, illustrating a part of the circuit of FIG. 6, shows a transistor 4 of the npn-type which is not connected to an associated current injector and which is controlled by means of a signal connection 5. The transistor 4 and the connection 5 correspond to the controlled transistor and signal connection described in the above-mentioned U.S. Pat. No. 4,007,385. The following description will be restricted to that part of the integrated circuit in which the addition of the second auxiliary transistor to obtain the improvements aimed at by the present invention is realized.

The controlled transistor 4 is situated at a stage of which most transistors are provided with bias current by means of one or more associated current injectors which are shown diagrammatically by the diode 1. This diode is present between the connections 2 and 3 with which the stage is incorporated in the series arrangement of stages. The signal connection 5 connects a controlling transistor present in a higher stage to the controlled transistor 4.

According to the invention, a second auxiliary transistor 6 is incorporated which is the same type as the controlled transistor 4. Both transistors 4 and 6 are npn-transistors. The second auxiliary transistor 6 is connected parallel to the emitter-base junction of the controlled transistor 4, in that the collector of transistor 16 is connected to the base of transistor 4 and furthermore the emitters of these two transistors are connected together. As an alternative, the emitter of transistor 6 may also be connected to another point of reference potential in the circuit present in a lower stage.

The second auxiliary transistor 6 is connected to a current injector denoted by the complementary and hence pnp-transistor 7 the emitter of which is connected to the connection 2 and the base of which is connected to the connection 3, the collector of transistor 7 leading to the base of the second auxiliary transistor 6.

During operation of the circuit, transistor 7 continuously supplies bias current to the base of the second auxiliary transistor 6 so that transistor 6 constitutes permanently a conductive connection between the base of the controlled transistor 4 and a suitable point of reference potential. By means of this conductive connection, a current having a maximum value $I_2$ can be dissipated, $I_2$ being determined by the base current supplied by the transistor 7 and the current gain factor $\beta$ of the second auxiliary transistor 6.

If a logic signal which corresponds to the conductive state of the controlled transistor 4 is to be transmitted to the stage shown by the signal connection, a current I controlled by the controlling transistor (not shown) is presented in the signal connection 5. A part $I_2$ hereof is drained by the second auxiliary transistor 6. The remaining part $(I-I_2)$ should be sufficiently large to bring and maintain the transistor 4 in the conductive state. The current $I_2$ is preferably adjusted at a value which is approximately equal to half of the current I.

When the logic signal changes, the current I in the signal connection 5 is interrupted. The second auxiliary transistor 6 goes on conveying current until all the charge stored in the transistor 4 and in the parasitic capacitances connected to the base thereof has disappeared and transistor 4 has been switched to the non-conductive stage. Due to the comparatively rapid dissipation of the stored charge, the switching time required for transistor 4 is considerably reduced.

In the circuit of FIG. 6, according to the invention, a second auxiliary transistor 82 is incorporated which is of the same type as the controlled transistor 73. Both transistors 73 and 82 are npn-transistors. The second auxiliary transistor 82 is connected parallel to the emitter-base junction of the controlled transistor 73, in that the collector of transistor 82 is connected to the base of the transistor 73 and furthermore the emitters of these two transistors are connected together. As an alternative, the emitter of transistor 82 may also be connected to another point of reference potential in the circuit present in a lower stage.

The second auxiliary transistor 82 is connected to a current injector denoted by the complementary and hence pnp transistor 83, the emitter of which is connected to the connection 81 and the base of which is connected to the connection 9, the collector of transistor 83 leading to the base of the second auxiliary transistor 82.

The circuit diagram shown in FIG. 7 illustrates an npn transistor 200 with a current injector which is incorporated in a stage, of the current injector(s) of which is (are) shown as transistor 201. The pnp auxiliary transistors 202 and 203 are arranged in the same stage. In the construction of this device, said transistors are situated preferably in proximity of the npn transistor 200. The npn transistor 200 is the controlling transistor.

An npn transistor 205 without an injector is present on a lower stage. Said stage has a current injector 206. Transistor 205 is the control transistor whose operating condition is determined by that of the controlling transistor 200.

In this embodiment the stage with the control transistor 205 is separated from the stage with the controlling transistor 200. However, the operation of the circuit shown is independent of the number of intermediate stages which number may also be zero, if desired.

As supply terminals of the circuit there are a negative terminal 207 which is connected to the second n-type layer or zone of the current injector 206 and a positive terminal 208 which is connected to the first p-type layer or zone of the current injector 101, respectively.

The emitter of the npn transistor 200 having a current injector coincidenced with the n-type region of the current injector 201 which constitutes the second layer of the current injector. The potential of the base region of transistor 200 depends on the signal source from the collector of transistor 201 via a conductor 209. The conductor 209 may be considered as a signal input and be connected for example to a collector of another transistor of said stage.

The emitter of the pnp auxiliary transistor 202 may be formed by a first layer of the current injector which is of the current injector 201. Said emitter has the same potential as the terminal 208. The base of the pnp auxiliary transistor 202 may be formed by a part of the second layer of the current injector as has at least the same potential as the base of current injector 201.

The collector diode of the pnp auxiliary transistor 202 and the emitter region of the pnp auxiliary transistor 203 may be formed by the same p-type zone. A conductor 210 connects said zone to (one of) the collector(s) of the controlling npn transistor 200.

The base of the pnp auxiliary transistor 203 is connected to the cathode of the transistor 201 and may be formed by a part of the same n-type region which forms the base of the auxiliary transistor 202. The collector of the pnp auxiliary transistor 103 may be a p-type zone which has an electric contact which is connected by a conductor 214 to the base of the npn transistor 205 which constitutes the controlled transistor. The emitter of the npn transistor 205 has the same potential as the second layer of the current injector(s) of said stage this is indicated by a connected 212 to the cathode of transistor 206 and the negative supply terminal 207.

Figure 2:
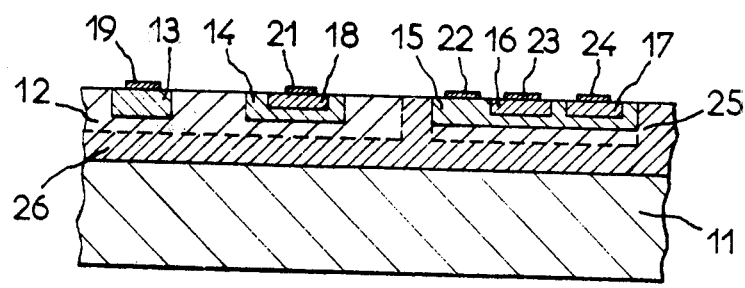
FIG. 2 is a diagrammatic sectional view of a part of an integrated I²L circuit in which the circuit diagram shown in FIG. 1 is constructed in a practical embodiment.

Returning to FIG. 1, the circuit elements 4, second auxiliary transistor 6 and 7 can simply be realized in an I²L circuit. FIG. 2 is a simplified illustration of a part of an integrated circuit comprising said circuit elements.

The integrated circuit having transistors provided with current injectors, or I²L circuit, comprises a semiconductor body having a substrate 11 which may be of p-type silicon. An n-type epitaxial layer 12 is present on the substrate 11. The controlled transistor 4 is an npn-transistor having a p-type base region 15 which is obtained by doping and which provides space for two collectors 16 and 17. The connections 22, 23 and 24 represent the base and collector contacts of the said transistor.

The epitaxial layer 12 is subdivided into a number of mutually isolated islands (not shown) in the usual manner. FIG. 2 shows a part of one of these islands with a buried layer 16 which is more highly doped than a remaining part of the epitaxial layer in which only the original doping concentration is present. The buried layer 26 is of the same conductivity type as the epitaxial layer and may be denoted n+.

Both the emitter of the controlled transistor 4 and the emitter of the second auxiliary transistor 6 are formed by the island shown. The base region 15 is surrounded by a more highly doped n+ region 25 which serves to increase the gain factor of said transistor 4 and which prevents that minority charge carriers or holes injected elsewhere in the epitaxial layer can be collected by the base region 15. The base region 15 is not connected to an associated current injector present in the same stage for supplying bias current.

The second auxiliary transistor 6 furthermore has a p-type base region 14 obtained by doping and a collector 18 which has a collector contact 21. Beside the base region 14 there is a further p-type region 13. The regions 13, 12 and 14 form a current injector associated with the second auxiliary transistor 6 and shown in FIG. 1 by the pnp-transistor 7. The region 13 is provided with a connection contact 19. The base region 14 need not have a base contact.

The second auxiliary transistor 6 is situated in the same stage as the controlled transistor 4 and both transistors are constructed with a so-called inverted transistor structure in which the same semiconductor region may serve as a common emitter for said transistors.

The regions 13 form the first layer of the current injector which is associated with the second auxiliary transistor 6 and which in this example consists of three layers. The region 13 may also form the first layer of current injectors associated with other transistors (not shown) of the same stage. In that case the current injectors have in common not only the first layer 13 but also the second layer formed by the n-type region 12, 25, 26.

Hence the first and the second layer of all the current injectors of the same stage will often have substantially the same potential. Thus the level of injection of charge carriers across the rectifying junction between said layers will also be substantially equal for all the current injectors. In so far as differently large bias currents are desired for various transistors, these can be adjusted with the distance between the layer which injects the charge carriers which are collected by the relevant base region; in the example, the region 13, and the relevant base region; in the example, the region 14. Actually, this distance determines the base width of the complementary transistor 7 and hence is an influence on the current gain factor of said complementary transistor. A further possibility of adjusting differently large bias currents resides in the fact that the bias current received by the base region 14 is also determined by the distance across which the emitter 13 and the collector 14 of the lateral pnp-transistor at the semiconductor surface are facing each other.

Besides by means of the supplied bias current the value of the current I₂ can also be influenced by the current gain factor of the second auxiliary transistor 6. In a known manner, the ratio between the current I₂ and the supplied bias current can be adjusted at a given value by providing in the base region 14 an extra collector having an area which is suitably chosen with respect to that of collector 18, which extra collector is short-circuited with the base region 14.

It will be obvious that the present invention is not restricted to the example described but that many variations are possible to those skilled in the art without departing from the scope of this invention. For example, other semiconductor materials may be used, for example, germanium or $A_{III}B_V$ compounds. An insulating layer may be provided on the semiconductor surface, across which conductor tracks extend which constitute the electric connections of the integrated circuit further shown in the diagram of FIG. 1.

The conductivity types given in the example may be reversed, in which case both directions for the currents I and I₂ will invert.

In the embodiment of FIG. 6 a second auxiliary transistor 82 was shown having its collector also connected to the base of transistor 73. In the embodiment of FIG. 7 transistor 216 serves the same function and in this embodiment is a third auxiliary transistor, on a stage lower than that of the first two auxiliary transistors 202 and 203.

Figure 3:
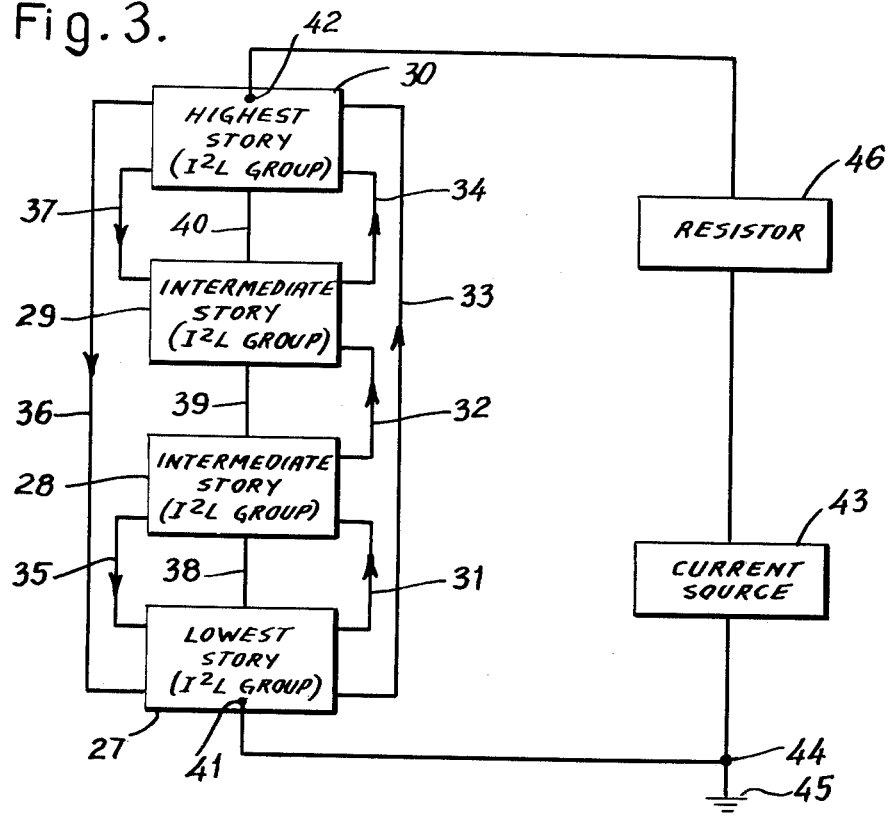
FIG. 3 shows a block diagram which illustrates the division of an I²L circuit into groups of transistors.

In FIG. 3 it has been assumed that the terminal 42 is connected to the first layer of the current injector or current injectors of the elementary group 30 and that the said group thus forms the uppermost or first stage or "storey" of the groups 27–30, and the group 27 forms the lowermost or last stage or "storey" of the groups 27–30.

The distribution of the components formed for example, by smaller base circuits or circuit elements between the elementary groups is independent of the function, in this case the signal processing of the integrated circuit. This means that the distribution of the components between the elementary groups need not go hand in hand with or adjoin a possible functional distribution—a distribution or partial functions—of the integrated circuits. The information or signal processing in the various elementary groups need, for example, not necessarily be effected parallel or in sequence after each other. In connection herewith it should be practically possible to transfer from a comparatively arbitrarily chosen point in one of the stages an information-carrying signal to a point in another stage via a conductive connection for further processing or, for example, for being combined there with other information-carrying signals. This is denoted in FIG. 3 by a number of communication lines 31–37 inclusive each provided with an arrow which denotes the direction of the information flow. So within the scope of the present invention there is distinguished between on the one hand supply lines and on the other hand functional or communication lines. Both types of lines are conductive connections, one type serving for the supply of supply current and/or supply voltage, and the other type for transferring electric signals with information contents.

Figure 4:
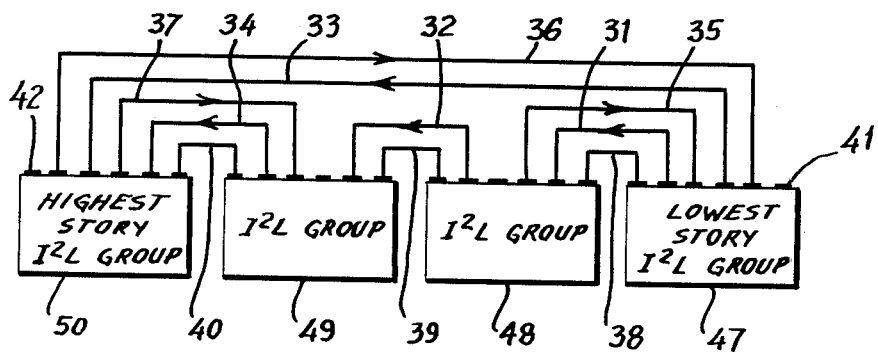
FIG. 4 shows diagrammatically an example in which the groups of transistors are each provided in a separate semiconductor body.

In the example shown in FIG. 4, the elementary groups of circuits 27, 28, 29 and 30 shown in FIG. 3 have been realized in the semiconductor chips 47, 48, 49 and 50, respectively. The connections 38, 39 and 40 are supply lines by which the various stages are connected in series. For that purpose the semiconductor bodies 47, 48, 49 and 50 have, for example, suitable conductive surfaces to which conductors can be connected, for example, by thermocompression or ultrasonic welding. The functional connections or communication lines between the elementary groups comprise at least one conductor which in the present case is also formed by a wire connection. In FIG. 4, the same reference numerals are used to denote the functional connections as in FIG. 3, in which the direction of the flow of information is denoted in a corresponding manner by means of arrows.

In another embodiment (FIG. 5) the elementary groups are provided in four isolated islands 51, 52, 53 and 54 in the same semiconductor body. This semiconductor body is, for example, of silicon and may consist of a p-type substrate 55 on which an n-type epitaxial layer 56 is provided which is subdivided in known manner by providing deep p-type regions 57, 58, 59, 60 and 61 into a number of parts which are isolated from each other and from the substrate 55 by p-n junctions. Each of the isolated parts of islands 51, 52, 53 and 54 has an n-type buried layer which is more highly doped than the overlying part of the epitaxial layer 56, in which moreover more highly doped n-type regions are provided in each island and extend from the surface down to or in the buried layer. Such highly doped n-type regions are present at least along the whole edge of the island in question.

Circuit elements which have a current injector are present in each of the islands. This is shown diagrammatically by means of the p-type zones 62, 73, 74 and 75 which each represent the first or injecting layer (or layers) of the current injector(s) used in the island in question.

A conductive connection 66 between the more highly doped edge of the isolated island 52 and the first layer 62 of the current injector(s) of the isolated island 51 is shown diagrammatically. Likewise, a conductor 67 connects the more highly doped edge of the isolated island 53 to the first layer 63 of the current injector(s) of the isolated island 52, while the conductor 68 constitutes the connection between the more highly doped edge of the isolated island 54 and the first layer 64 of the current injector(s) of the isolated island 53. A conductive connection 69 is furthermore provided between the more highly doped edge of the isolated island 51 and the deep p-type region 57. The conductive connections 66, 67, 78 and 69 may consist, for example, of aluminum tracks which are provided in the usual manner on an insulating layer of, for example, silicon dioxide present on the semiconductor body and which form ohmic contacts with the said p- and n-type regions in apertures in the insulating layer. The first layer 65 of the current injector(s) of the island 54 and the p-type region 57 connected to the island 51 have terminals 41 and 42, respectively, for example, in the form of conductor tracks which have a connection surface for connecting conductors by thermocompression or ultrasonic welding.

Figure 5:
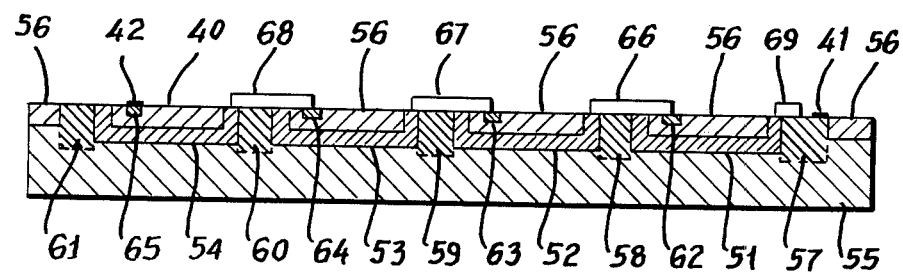
FIG. 5 shows diagrammatically an embodiment in which the groups of transistors are each provided in an isolated island of a common semiconductor body.

The input(s) for the supply of information to the subdivided integrated circuit realized in the isolated islands 51, 52, 53 and 54, as well as the output(s) from which the information-carrying signals generated by said circuits can be derived are not shown in FIG. 5 for clarity.

The voltage applied across the isolating p-n junction of the island 51 is zero because said island is connected by the conductor 69 to the p-type region 57 and hence also the substrate 55. The p-n junctions which isolate the islands 52, 53 and 54 are then automatically biased in the reverse direction as a result of the positive voltages of approximately 0.7 volts, approximately 1.4 volts and approximately 2.1 volts, respectively, which for said islands result from the distribution of the overall supply voltage between the various stages.

Starting from the forward direction of the first rectifying junction of the current injectors which are shown diagrammatically in FIG. 5, the negative polarity will be presented to the terminal 41 and the positive polarity of the supply will be presented to the terminal 42.

The conductivity types given in the examples are meant only by way of example and they may simply be changed if the polarities of the applied voltages are also reversed.

The preceding examples show that the elementary groups can be arranged in series with a supply source in a comparatively simple manner in the form of stages. As a result of the series arrangement, however, a difference in direct voltage level will occur between the information-carrying signals in various stages. This direct voltage difference may form a restriction for the functional communication between the various stages. The practical attractiveness of the subdivision into stages of the integrated circuit is also determined by the practical consequences of the said direct voltage difference. Of importance is how far an information-carrying signal available in the integrated circuit in a given stage is directly suitable or can at least simply be adapted to control therewith a part of the circuit present in another stage. Consequently, an important aspect of the invention is how the communication between the various stages, or the transfer of information from one stage to another can be realized.

What is claimed is:

1. An integrated circuit comprising:
controlling and controlled transistors of a first conductivity type having bases and collectors;
associated biasing current injectors connected to at least some of said transistors to bias same;
said associated biasing current injectors each having at least first, second and third zones with said first and second zones forming a first rectifying junction and said second and third zones forming a second rectifying junction;
means connecting said controlling transistor collectors to said controlled transistor bases;
said transistors and associated current injectors forming plural elementary groups in which said transistors require substantially the same supply current and each with a current injector;
two terminals for connection to a current source means;
means connecting said plural groups in series across said two terminals for said current source means so as to include a first in the series defined as the highest stage, a last in the series defined as the lowest stage, higher and lower stages being defined as the higher stage being closer to the beginning of the series than a lower stage;

said series connecting means including means connecting the current injector first zone of the group of transistors in the highest stage, without the interconnection of further stages, to said current source means terminal for biasing the first rectifying junction in the forward direction;

means connecting the current injector second zone of the group of transistors in said lowest stage, without the interposition of further stages, to the other current source means terminal;

means connecting the current injector second zone of the highest stage to the current injector first zone of the next lower stage;

and means providing a signal connection between a controlling transistor collector of a higher stage and a controlled transistor base of a lower stage;

said signal connection means comprising a signal controlled current source means for actuating said control transistor to which it is connected by supplying base drive current thereto and including a transistor of a second conductivity type complementary to said controlling and controlled transistors, said control transistor base to which said signal connection is provided being free of any other current source drive capable of actuating said controlled transistor in the absence of current flow along said signal connection;

said second conductivity type complementary transistor having emitter, base and collector, and being located in said higher stage;

means connecting said transistor emitter to the current injector first zone of said higher stage;

means connecting said transistor base to the controlling transistor collector;

means connecting said complementary transistor collector to the controlled transistor base; and an auxiliary transistor of the same conductivity type as said controlled and said controlling transistors in a stage lower than said highest stage, connected to an associated current injector and being connected parallel to the emitter base junction of said controlled transistor, said auxiliary transistor being connected so as to be rendered conductive at least during the period in which said controlled transistor is conductive for bringing said controlled transistor more rapidly into a non-conductive state.

2. An integrated circuit as claimed in claim 1, wherein said auxiliary transistor forms a permanent conductive connection between said base and said emitter of said controlled transistor.

3. An integrated circuit as claimed in claim 1, wherein said auxiliary transistor is situated in the same stage as said controlled transistor.

4. An integrated circuit as claimed in claim 3, wherein said current injector associated with said auxiliary transistor has at least three successive layers, the first and the second layer being formed by the same layers as the first and the second layer of the current injector associated with the other transistors present in the same stage.

5. An integrated circuit as claimed in claim 1, wherein the maximum collector current of said auxiliary transistor is substantially half of the current flowing in the signal connection in the conductive state.

6. An integrated circuit comprising:

controlling and controlled transistors of a first conductivity type having bases and collectors;

associated biasing current injectors connected to at least some of said transistors to bias same;

said associated biasing current injectors each having at least first, second and third zones with said first and second zones forming a first rectifying junction and said second and third zones forming a second rectifying junction;

means connecting said controlling transistor collectors to said controlled transistor bases;

said transistors and associated current injectors forming plural elementary groups in which said transistors require substantially the same supply current and each with a current injector;

two terminals for connection to a current source means;

means connecting said plural groups in series across said two terminals for said current source means so as to include a first in the series defined as the highest stage, a last in the series defined as the lowest stage, higher and lower stages being defined as the higher stage being closer to the beginning of the series than a lower stage;

said series connecting means including means connecting the current injector first zone of the group of transistors in the highest stage, without the interconnection of further stages, to said current source means terminal for biasing the first rectifying junction in the forward direction;

means connecting the current injector second zone of the group of transistors in said lowest stage, without the interposition of further stages, to the other current source means terminal;

means connecting the current injector second zone of the highest stage to the current injector first zone of the next lower stage;

and means providing a signal connection between a controlling transistor collector of a higher stage and a controlled transistor base of a lower stage;

said signal connection means comprising a signal controlled current source means for actuating said control transistor to which it is connected by supplying base drive current thereto, said controlled transistor base to which said signal connection is provided being free of any other current source drive capable of actuating said controlled transistor in the absence of current flow along said signal connection;

said signal controlled current source means comprising first and second auxiliary transistors of a second conductivity type complementary to that of said controlling and controlled transistors and being located in said higher stage and each having emitter, base and collector;

said first auxiliary transistor emitter being connected to the current injector first zone of said higher stage;

said first auxiliary transistor collector and second auxiliary transistor emitter being connected to the controlling transistor collector;

said second auxiliary transistor collector being coupled to the base of said controlled transistor in said lower stage; and both auxiliary transistor bases being connected to the current injector second zone of said higher stage; and a third auxiliary transistor of the same conductivity type as said controlled and said controlling transistors in a stage lower than said highest stage, connected to an associated current injector and being connected parallel to the emitter base junction of said controlled transistor, said third auxiliary transistor being connected so to be rendered conductive at least during the period in which said controlled transistor is conductive for bringing said controlled transistor more rapidly into a non-conductive state.

7. An integrated circuit as claimed in claim 6, wherein said third auxiliary transistor forms a permanent conductive connection between said base and said emitter of said controlled transistor.

8. An integrated circuit as claimed in claim 6, wherein said third auxiliary transistor is situated in the same stage as said controlled transistor.

9. An integrated circuit as claimed in claim 8, wherein said current injector associated with said third auxiliary transistor has at least three successive layers, the first and the second layer being formed by the same layers as the first and the second layer of the current injector associated with the other transistors present in the same stage.

10. An integrated circuit as claimed in claim 6, wherein the maximum collector current of said third auxiliary transistor is substantially half of the current flowing in the signal connection in the conductive state.

* * * * *